United States Patent
Balasubramanian et al.

(10) Patent No.: US 11,994,559 B2
(45) Date of Patent: May 28, 2024

(54) TESTS FOR INTEGRATED CIRCUIT (IC) CHIPS

(71) Applicant: TEXAS INSTRUMENTS INCORPORATED, Dallas, TX (US)

(72) Inventors: Lakshmanan Balasubramanian, Bangalore (IN); Rubin Parekhji, Bangalore (IN); Kalyan Chakravarthi Chekuri, Bangalore (IN); Swathi G, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/871,205

(22) Filed: Jul. 22, 2022

(65) Prior Publication Data
US 2023/0143500 A1 May 11, 2023

(30) Foreign Application Priority Data
Nov. 8, 2021 (IN) .............................. 202141051160

(51) Int. Cl.
*G01R 31/3183* (2006.01)
*G06F 30/30* (2020.01)

(52) U.S. Cl.
CPC .................. *G01R 31/31835* (2013.01); *G01R 31/318307* (2013.01); *G01R 31/318357* (2013.01); *G06F 30/30* (2020.01)

(58) Field of Classification Search
CPC ...... G01R 31/31835; G01R 31/318307; G01R 31/318357; G06F 30/30

(Continued)

(56) References Cited

U.S. PATENT DOCUMENTS

| | | | |
|---|---|---|---|
| 7,219,287 B1 * | 5/2007 | Toutounchi | G01R 31/31835 714/25 |
| 7,509,551 B2 * | 3/2009 | Koenemann | G01R 31/31703 714/732 |

(Continued)

OTHER PUBLICATIONS

Morrin, Mixed-Mode Simulation for Time-Domain Fault Analysis, 1989, IEEE, pp. 231-241. (Year: 1989).*

(Continued)

*Primary Examiner* — John J Tabone, Jr.
(74) *Attorney, Agent, or Firm* — Ronald O. Neerings; Frank D. Cimino

(57) ABSTRACT

A method for evaluating tests for fabricated integrated circuit (IC) chips includes providing, design for fault injection (DfFI) instances of an IC design that characterize activatable states of controllable elements in an IC chip based on the IC design. The method also includes fault simulating the IC design a corresponding identified test suite to determine a signature for faults and simulating the IC design with the DfFI instances activated to determine a signature for the DfFI instances. The method includes generating a DfFI-fault equivalence dictionary based on a comparison of the signature of the faults and DfFI instances and generating tests for a fabricated IC chip based on the IC design. The method includes receiving test result data characterizing the tests being applied against the fabricated IC chip with the DfFI instances activated and analyzing the test result data to determine an ability of the tests to detect the faults.

20 Claims, 6 Drawing Sheets

(58) Field of Classification Search
USPC .................. 714/732, 737, 740, 741, 742
See application file for complete search history.

(56) References Cited

U.S. PATENT DOCUMENTS

| | | | |
|---|---|---|---|
| 8,122,423 B2 | 2/2012 | Zjajo et al. | |
| 8,166,360 B2* | 4/2012 | Koenemann | G01R 31/31703 |
| | | | 714/732 |
| 8,615,695 B2* | 12/2013 | Guo | G01R 31/318525 |
| | | | 714/732 |
| 8,990,760 B2 | 3/2015 | Hapke et al. | |
| 10,346,273 B2 | 7/2019 | Fricano et al. | |
| 11,182,525 B1 | 11/2021 | Sokar et al. | |
| 11,429,776 B1* | 8/2022 | Chokhani | G06F 30/398 |
| 11,630,938 B1* | 4/2023 | Lorenzini | G06F 11/261 |
| | | | 703/14 |
| 2007/0038911 A1* | 2/2007 | Koenemann | G01R 31/31703 |
| | | | 714/732 |
| 2009/0177936 A1* | 7/2009 | Koenemann | G01R 31/31703 |
| | | | 714/E11.155 |
| 2010/0229061 A1 | 9/2010 | Hapke et al. | |
| 2023/0143500 A1* | 5/2023 | Balasubramanian | G06F 30/30 |
| | | | 714/732 |

OTHER PUBLICATIONS

Devarayanadurg, et al.: "Analytical Fault Modeling and Static Test Generation for Analog ICs †"; 1994 ACM 0-89791-690-5/94/0011/0044; found on the internet Jul. 22, 2022 @ https://citeseerx.ist.psu.edu/viewdoc/download?doi=10.1.1.1054.5435&rep=rep1&type=pdf.

Fraccaroli, et al.: "Fault Analysis in Analog Circuits through Language Manipulation and Abstraction"; found on the internet Jul. 22, 2022 @ https://eprints.soton.ac.uk/412752/1/PID4920793.pdf.

* cited by examiner

TESTS FOR INTEGRATED CIRCUIT (IC) CHIPS

CROSS-REFERENCE TO RELATED APPLICATION

This application claims the benefit of priority to India Provisional Application No. 202141051160 filed on 8 Nov. 2021, the entirety of which is incorporated herein by reference.

TECHNICAL FIELD

This relates generally to generating tests for integrated circuit (IC) chips.

BACKGROUND

A mixed-signal integrated circuit (IC) chip is an IC chip that includes both analog circuits and digital circuits on a single semiconductor die. In some examples, the digital circuits are employable to control operations of the analog circuits.

Fault models, in the context of IC chips, refers to an attempt to model an impact of different types of physical defects, which can occur on IC chips. Fault models are employed to model or emulate the behavior of faulty IC chips and thereby predict the operation of the circuit in the presence of these faults. Fault models are employed in analog and mixed-signal IC chip testing.

SUMMARY

In a first example, a method for evaluating tests for fabricated integrated circuit (IC) chips includes providing, by an IC fault engine operating on a computing platform, design for fault injection (DfFI) instances of an IC design that characterize activatable states of controllable elements in an IC chip based on the IC design. The method includes fault simulating, by an analog fault simulator (AFS) operating on the computing platform, the IC design and a corresponding identified test suite to determine a signature for faults. The method includes simulating, by a circuit simulator operating on the computing platform, the IC design with the DfFI instances activated to determine a signature for the DfFI instances. The method also includes generating, by the IC fault engine, a DfFI-fault equivalence dictionary based on a comparison of the signature of the faults and the signatures of the DfFI instances. The method includes generating and/or managing, by an IC test engine operating on the computing platform, tests for a fabricated IC chip that is based on the IC design and receiving, by the IC test engine, test result data that characterizes the tests being applied against the fabricated IC chip based on the IC design with the DfFI instances activated. The method further includes analyzing, by the IC test engine, the test result data to determine an ability of the tests to detect the faults.

In a second example, a system for evaluating tests for IC chips includes a non-transitory memory for storing machine readable instructions and a processing unit for accessing the non-transitory memory and executing the machine readable instructions. The machine readable instructions include an IC fault engine that is configured to provide DfFI instances of an IC design that characterize activatable states of controllable elements in an IC chip based on the IC design and generate a fault universe based on data from an AFS characterizing faults, test and signatures of the faults. The IC fault engine generates a DfFI universe based on data from a circuit simulator characterizing signatures of the DfFI instances and generates a DfFI-fault equivalence dictionary based on a comparison the signature of the faults and the signatures of the DfFI instances. The machine readable instructions also include an IC test engine configured to generate tests for a fabricated IC chip that is based on the IC design and receive test result data that characterizes the tests being applied against the fabricated IC chip based on the IC design with the DfFI instances activated. The IC test engine is also configured to analyze the test result data to determine an ability of the tests to detect the faults.

DETAILED DESCRIPTION

Figure 1:
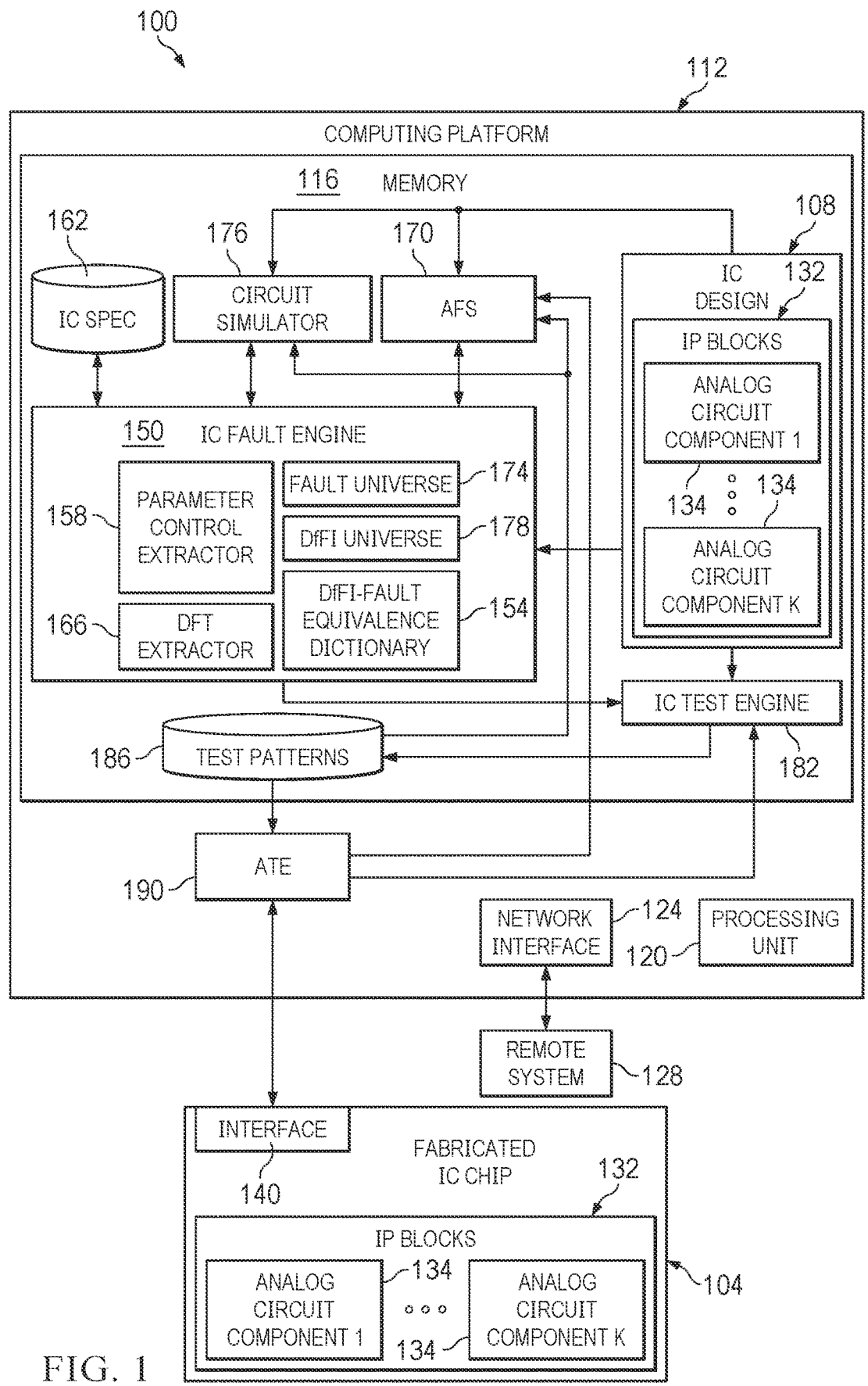
FIG. 1 illustrates an example of a system for eliciting surrogate behavior for faults and/or marginalities for testing a fabricated IC chip.

Analog and mixed-signal (AMS) fault coverage analysis entails execution of analog and/or AMS fault simulation (AFS) prior to fabrication (e.g., at a design stage) to fault grade a selected test suite, and to identify a need for modification of the test suite (either reduction or augmentation) for test cost and quality improvements. The outcome of the AFS is limited to fault models and the test suite considered for simulation. However, silicon correlation (e.g., correlation against fabricated IC chip test results) is needed for validating the AFS outcomes. Stated differently, verification is needed to ensure that fabricated IC chip test failure or fall-out (referred to sometimes as silicon fall-out) is in proportion to the fault coverage obtained through AFS.

For integrated circuit (IC) chips that include an analog component, such as AMS system on a chip (SoC), parameter controls (e.g., digital controls) are sometimes included to enable trimming of particular analog parameters for the variations due to process, voltage, temperature (PVT) and other conditions, calibration of certain circuit performance, and other functional or parametric configuration including power-performance tradeoffs. In some examples, there are unused portions of the parameter controls built in to the IC design. In some examples, the parameter controls are designed to cover controllability and/or programmability of targeted parameter(s) across the entire range such parameter(s) can assume (e.g., take effect in fabricated IC chips) across the applicable PVT condition space. Thus, for a given IC chip sample, and given PVT condition, one particular combination of parameter controls per parameter is valid and the rest of them remain unused in the given context. These additional and/or unused parameter controls or parameter control states or combinations of parameter control states, also referred to as overdesign elements, are employable as effective additional tuning range to potentially impose a deviant circuit behavior that is sometimes employable to enable mimicking (emulation) of a fault and/or other anomalies.

Additionally or alternatively, some IC designs include design for testability (DFT) elements for test access that are controllable and observable with an analog test bus and testable either using stimulus generators and measuring instruments external to the IC chip or built in self test (BIST) schemes implemented within the IC chip or combinations of both. In such examples, the analog test bus is employed to bring controllability and visibility to internal circuit nodes and branches using analog multiplexers and/or switches to apply or observe node voltages or branch currents as needed. These DFT elements are design for testing the IC chips, but are alternatively employable to induce faulty circuit behavior in an IC chip.

Taken together, the extra parameter controls and the DFT elements of the analog circuits within the IC chip are employable as controllable elements to generate design for fault injection (DfFI) instances. Each DfFI instance represents a particular activated combination of controllable elements such as the extra parameter controls and DFT elements. Both AFS and circuit simulation are executed to analyze an equivalency between faults and DfFI instances. More particularly, the AFS reveals a behavioral signature (referred to more simply as a signature) for activated DfFI instances of each fault. As one example, a signature defines the state of a circuit in the presence of a single fault either at a given strobe point or across an entire strobe time interval. In another example, a signature refers to a collection of states due to an ensemble of faults, when strobed at a given time or across a time interval. In some examples, these signatures include a simple pass or fail indication from an external or on-chip measurement units, including but not limited to a built in self test (BIST) circuit upon observing multiple internal nodes and branches or IC chip pins. Additionally, in some examples, these signatures include simple parameters such as an instantaneous voltage or current (or other electrical parameters such as impedance, frequency etc.) measured at one or more identified observable node(s) or branch(s) under a certain condition. In still other examples, these signatures include more complex and derived parameters, such as an average, root mean square (RMS), minimum or maximum values of voltage or current (or other electrical parameters such as impedance, frequency etc.) measured at one or more identified observable node(s) or branch(s) under a certain condition. Further, in some examples, these signatures include even more complex sequence of events including, but not limited to an explicit qualification of certain critical conditions under which the measurements are made and the voltage or current (or other electrical parameters such as impedance, frequency etc.) are measured at one or more identified observable node(s) or branch(s) under one or more conditions.

DfFI instances are employable to evaluate conditions leading to ease of fault detection or otherwise, and thereby provides a way to map DFT elements in specific, and DFT techniques in general, for fault coverage improvement to different portions of the circuit. In particular, a circuit simulator simulates the IC design with each DfFI instance and identifies the signature of the DfFI instances. The signatures of the DfFI instances are compared with the signatures of the faults. For instance, in one example, suppose a given fault has the same signature as a given DfFI instance, such that the given fault is mimicked by the given DfFI instance. In this example, the given DfFI instance is employable as a surrogate for the given fault. Thus, a dictionary of equivalence between individual DfFI elements and individual faults in the fault universe, referred to as a DfFI-fault equivalence dictionary, is generated that characterizes faults and equivalent DfFI instances that are employable to mimic the faults. In some examples, if the fault coverage provided by the DfFI-fault equivalence dictionary does not meet a fault coverage threshold (e.g., the fault coverage is not sufficient), additional DfFI elements are added to the IC design, and the DfFI-fault equivalence dictionary is updated.

In response to providing a DfFI-fault equivalence dictionary that meet the fault coverage threshold (e.g., has sufficient fault coverage), the IC design is released for fabricating a limited number of samples that are presumed to be fault free and covering allowable process variation extremities that can happen during high volume mass fabrication. Moreover, simulation models of test programs, referred to as tests are generated/identified for the limited sample of fabricated IC chips which are usually a superset of tests applied on mass/volume fabricated. The tests include the characterization tests which are difficult to be applied during volume testing due to impractical test time and test cost implications; as such characterization tests are usually performed in a laboratory based characterization needed for extended IC datasheet parameter signoff across carefully chosen process corner lot samples to represent the extremal process variations during mass fabrication and these characterization tests are not focused on detecting manufacturing defects. Each of the tests is applied to an instance of the fabricated IC chip with each of the DfFI instances in the DfFI-fault equivalence dictionary activated, and test result data is recorded. The test result data is analyzed to reveal the DfFI instance that caused particular tests to fail. For instance, continuing with the above example, suppose that a given test activated the given DfFI instance, and the fabricated IC chip is recorded to have failed the given test. In this situation, the given test has been verified to test for the given fault because the given DfFI instance (that caused the given test to fail) has already been determined to have the same signature as the given fault within acceptable error limits. Accordingly, the generated/identified tests for the fabricated IC chips are verified to test for faults in the IC chips. Further, in some examples, more tests and/or more DfFI instances are added to ensure that the tests meet the fault coverage threshold.

In response to determining that the generated/identified tests for the limited sample of fabricated IC chips provide sufficient fault coverage, the IC design is released for volume (e.g., large scale) fabrication of IC chips. Additionally, because the tests generated have been verified to provide sufficient fault coverage, these tests are employable to test the volume fabrication IC chips prior to distribution of the fabricated IC chips to third parties (e.g., customers). Accordingly, by establishing a DfFI-fault equivalence, and then establishing a test to DfFI equivalence, controllable elements (such as tuning parameters and DFT elements) that are already present in IC design of AMS circuits and systems are leveraged for inducing faulty circuit behavior, which is employable to mimic faults in an IC chip. Thus, tests for the limited sample of the IC chips based on the IC design are verified to test for faults in the IC chip before the IC design is released for volume fabrication.

FIG. 1 illustrates an example of a system 100 for eliciting surrogate behavior for faults and/or marginalities for testing a fabricated IC chip 104 (alternatively referred to as a system on a chip (SoC)) that is based on an IC design 108, which is alternatively referred to as pre-fabricated, or more commonly as pre-silicon intellectual property (IP). The system 100 enables defect oriented testing prior to a large scale production run of the fabricated IC chip 104. More particularly, the system 100 enables design for fault injection (DfFI) instances that are correlated with simulated faults in the fabricated IC chip 104. These DfFI elements are employable to mimic defective circuit behavior during analog fault simulation (AFS) and during post production tests. More specifically, the DfFI instances are employed at design time to emulate and evaluate effects of injected faults for the purpose of analyzing circuit behaviors for determining test pattern sufficiency and for identification of new test conditions and new tests to be created. Also, the DfFI instances are used at production test time, (e.g., at time zero), to evaluate the effect of injected faults on silicon performance including catastrophic and parametric change behaviors.

The system 100 can include a computing platform 112. Accordingly, the computing platform 112 can include a memory 116 for storing machine readable instructions and data and a processing unit 120 for accessing the memory 116 and executing the machine-readable instructions. The memory 116 represents a non-transitory machine-readable memory (or other medium), such as random access memory (RAM), a solid state drive, a hard disk drive or a combination thereof. The processing unit 120 can be implemented as one or more processor cores. The computing platform 112 can include a network interface 124 (e.g., a network interface card) configured to communicate with other computing platforms via a network, such as a public network (e.g., the Internet), a private network (e.g., a local area network (LAN)) or a combination thereof (e.g., a virtual private network).

The computing platform 112 could be implemented in a computing cloud. In such a situation, features of the computing platform 112, such as the processing unit 120, the network interface 124, and the memory 116 could be representative of a single instance of hardware or multiple instances of hardware with applications executing across the multiple of instances (e.g., distributed) of hardware (e.g., computers, routers, memory, processors, or a combination thereof). Alternatively, the computing platform 112 could be implemented on a single dedicated server or workstation.

The IC design 108 can be stored in the memory 116 of the computing platform 112. The IC design 108 can be implemented, for example, as design specifications for a fabricated IC chip 104. The IC design 108 can be generated with an electronic design automation (EDA) application operating on a remote system 128, such as a logic synthesis application (e.g., a synthesis tool) or a functional simulation application (e.g., a logic or circuit simulation tool). For instance, an end-user of the EDA application can employ a user-interface to generate and/or modify features characterizing a circuit transformable by an EDA application into a physically realizable netlist for the IC design 108 or a simulation model of the netlist for the IC design 108.

As noted, in the examples described, the fabricated IC chip 104 represents a physically instantiated version of the IC design 108. More particularly, the fabricated IC chip 104 and the IC design 108 includes IP blocks 132, and at least one IP block 132 includes K number of analog circuit components 134, where K is an integer greater than or equal to one. In some examples, one of the K number of analog circuit component 134 is representative of an operational amplifier (op-amp) or other analog circuit. In some examples, one of the K number of analog circuit components 134 represents a voltage supply, such as a low dropout regulator (LDO) voltage regulator, and includes constituent components that are controllable by external elements within the IP block 132. In many instances, there can be virtually any number of IP blocks 132 in the IC design 108 (e.g., hundreds to millions).

The fabricated IC chip 104 can include an interface 140 that enables external systems to provide stimuli to the components of the fabricated IC chip 104, including the IP blocks 132 of the fabricated IC chip 104. The interface 140 can conform to the standards set forth in the IEEE 1149.1 standards, IEEE 1149.4 standards, IEEE 1149.5 standards, IEEE 1149.6 standards, IEEE 1149.7 standards, IEEE 1687 standards, their variants and derivatives or can be implemented with other techniques, such as general purpose input and output (GPIO) interface, wafer probes, and standard package pins.

The memory 116 includes an IC fault engine 150 which can be implemented as application software or a software module. The IC fault engine 150 is configured to generate a DfFI-fault equivalence dictionary 154 that identifies faults in the K number of analog circuit components 134 (or some subset thereof) and corresponding DfFi instances. The DfFI-fault equivalence dictionary 154 provides a dictionary of equivalence between a DfFI universe and the fault universe. To facilitate understanding of the operations of the IC fault engine 150, a given example ("the given example") is provided and explained with respect to FIGS. 1-3. The given example illustrates and describes how a fault equivalency of a given analog circuit component 134 of the IC design 108 is recorded in the DfFI-fault equivalence dictionary 154. In the given example, it is presumed that one of the given analog circuit component 134 is an LDO voltage regulator.

To determine the DfFI elements of the IC design 108, a parameter control extractor 158 of the IC fault engine 150 parses an IC specification 162 of the IC design 108 to identify a set of parameter controls for the K number of analog circuit components 134. The IC specification 162 includes a list of analog components and defines the operating parameters and the sets of parameter controls for each such component. In some examples, the IC specification 162 is provided from the remote system 128. The sets of parameter controls are implemented as digital controls, such as registers that modulate a performance parameter of a corresponding analog circuit component 134. In some examples, the IC specification 162 also includes an indication of a pin description (including physical parameters) of the IC design 108, and/or operational specifications of the IC design 108. In various examples, the sets of parameter controls are employable to control trimming parameters, such as an offset voltage, a calibration voltage, a bandgap voltage, gain bandwidth product, etc. In the given example, the parameter control extractor 158 identifies a set of parameter controls that control a parameter for the given analog circuit component 134. Moreover, in the given example, it is presumed that the set of parameter controls adjust the level of output voltage of the given analog circuit component 134. That is, the set of parameter controls of the given analog circuit component 134 trim the output voltage level of the LDO voltage regulator.

Figure 2:
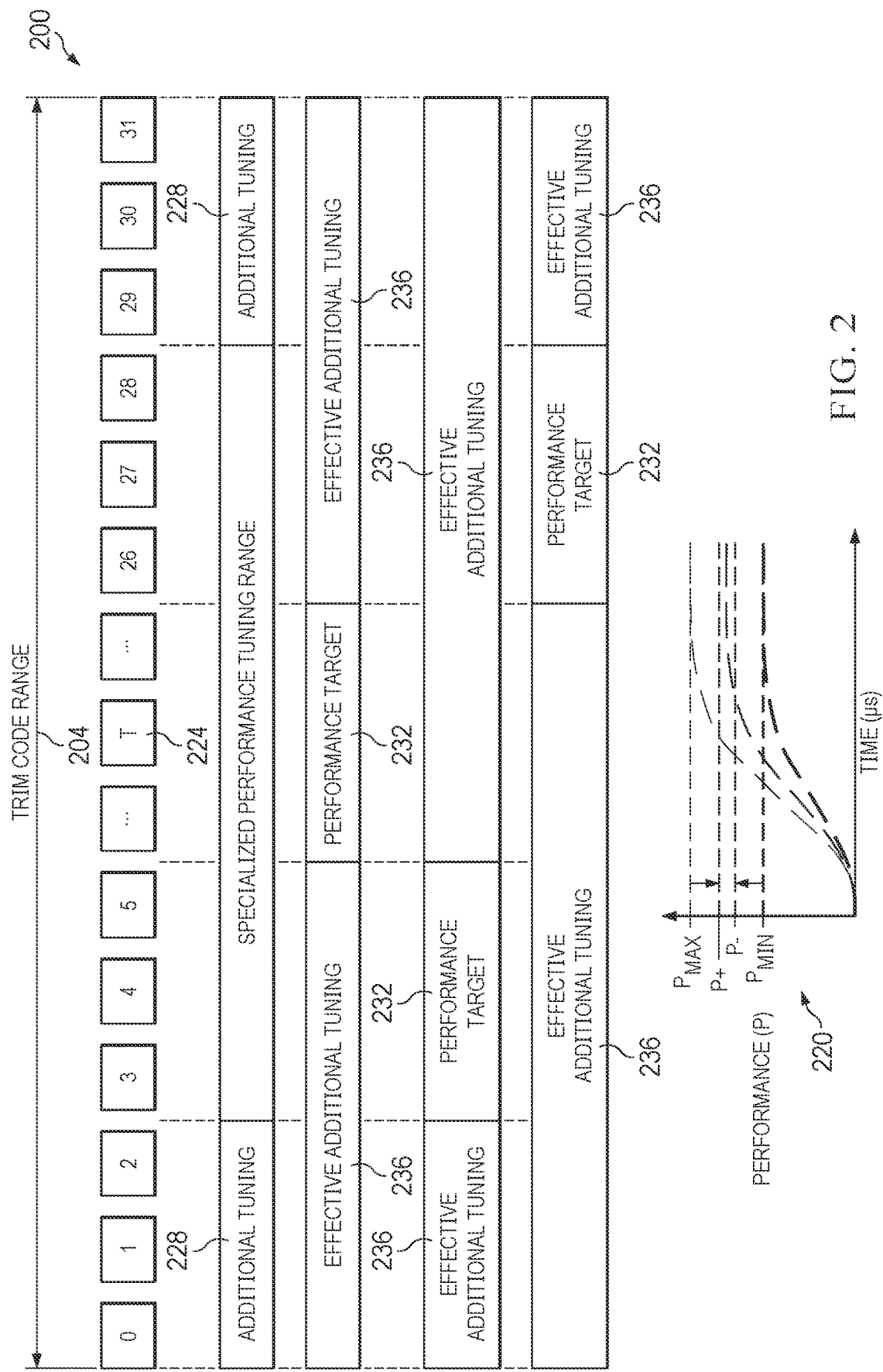
FIG. 2 illustrates an example of a set of parameter controls of analog function an analog parameter trim for an analog circuit component.

FIG. 2 illustrates a set of parameter controls 200 of a digitally controlled analog function in the context of an analog parameter trim for an analog circuit component, such as the given analog circuit component of the given example. The set of parameters controls 200 are specified in an IC specification (e.g., the IC specification 162 of FIG. 1). The set of parameter controls 200 are represented as a trim code range 204 that has 32 unique values, namely, trim codes 0 to 31 to control an analog parameter of interest (e.g., LDO output voltage, offset voltage, gain bandwidth product, reference voltage, bias current, gain and bandwidth of an error amplifier, etc.). Each trim code is unique and results in a particular change (delta) in the performance of the analog circuit. In some examples, this change is included in a component library (e.g., the IC specification 162 of FIG. 1).

FIG. 2 also includes a graph 220 that plots the performance variation as a function of time for the given example. The analog parameter of interest varies across IC fabrication process corners and varies between a minimum ($P_{MIN}$) performance value to maximum ($P_{MAX}$) value and settles at nominal (P) value for a nominal process corner. In the graph 220, the performance target of P has an allowed tolerance between $P_+$ and $P_-$ (wherein $P_{MAX} > P_+ > P$ and $P_{MIN} < P_- < P$). The set of parameter controls provides a parametric performance trim that enables a circuit implementing the analog circuit component to keep the performance within the target P across the entire fabrication process corners. In the given example, the trim code range 204 is a set of digital values from 0 to 31 (32 different values) that adjust the output voltage of the given analog circuit (an LDO voltage regulator). Each value of the trim code range 204 increases or decreases the performance value by a unique amount.

In the example illustrated, for a design centered around the nominal process condition, and a default trim control value at T (e.g., 15), there is no user specified post-production trim configuration needed to keep the performance of the analog circuit within the target range (e.g., between $P_+$ and $P_-$). However, for other process corners or conditions, a user defined trim configuration is employed. In some examples, the trim control has a target variation to be less than or equal to the variation due to one bit change in trim control (e.g., from T−1 to T+1). Additionally, for the worst case process corners corresponding to the maximum ($P_{MAX}$) and minimum ($P_{MIN}$) parameter values, the corresponding trim code may be set to $T_{MAX}$ (4) and $T_{MIN}$ (27) respectively. To implement a trim range between 3 and 28, labeled as the specified performance tuning range 224, a 5-bit trim code is needed with a redundant range between 0 to 2 and 29 to 31. Further upon effective application of a trim code (either default or user applied) there will be a redundant 29-bit configuration that can not be exercised given the process corner. These redundancies, also referred to as intentional overdesign elements, are employable as effective additional tuning range to potentially impose a deviant circuit behavior including emulation of fault and other anomalies. These intentional overdesign elements are labeled as additional tuning elements 228.

Further, in some examples, the IC specifications (or other specifications) include an indication that a particular performance target range 232 will be used for a particular IC sample that corresponds to the IC design (e.g., due to process variations). In such examples, a performance target range 232 is smaller than the specified performance tuning range 224. For instance, in some examples, the particular performance target range 232 is 3 values within the trim code range 204. In these situations, an effective tuning range 236 is provided, wherein the effective tuning range 236 is greater than the additional tuning elements 228. In either situation, a parameter performance extractor (e.g., the parameter performance extractor 158 of FIG. 1) determines a set of extra parameter controls that includes the additional tuning elements 228 and/or the effective tuning range 236.

Referring back to FIG. 1, the parameter control extractor 158 determines extra parameter controls for the K number of analog circuit components 134 in a manner similar to the procedure explained with respect to FIG. 2. These extra parameter controls are overdesign elements employable to mimic faults and/or marginalities.

Also, the IC fault engine 150 includes a design for test (DFT) extractor 166 that selects DFT elements present in the IC design 108 for the K number of analog circuit components 134. In some examples, the IC specification 162 includes a list of the corresponding DFT elements, as well as an analog test bus address needed to control the DFT elements. Additionally or alternatively, the DFT extractor 166 parses the netlist of the IC design 108 to determine the DFT elements for the K number of analog circuit components 134. In any of these examples, the DFT extractor 166 is also configured to analyze a netlist of the K number of analog circuit components 134 to identify design for test (DFT) elements that are employable to mimic faults and/or marginalities (e.g., anomalies caused by process variation).

Figure 3:
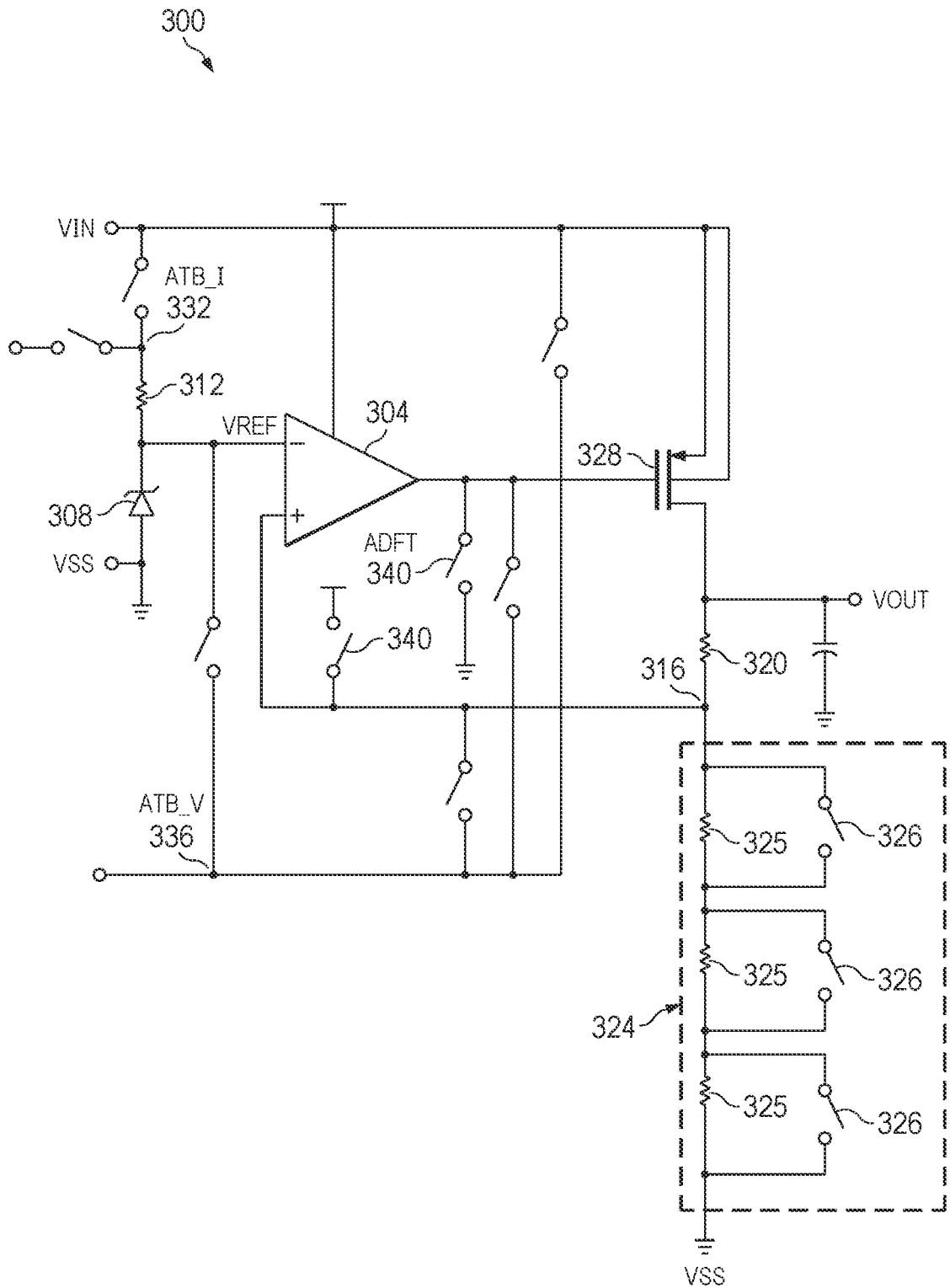
FIG. 3 illustrates a low dropout (LDO) voltage regulator with design for test (DFT) elements for test access that are employable to mimic faults and/or marginalities.

Continuing with the given example, FIG. 3 illustrates an LDO voltage regulator 300 with DFT elements for test access that are employable to mimic faults and/or marginalities. The LDO voltage regulator includes an op-amp 304. The LDO voltage regulator 300 includes a reference voltage (VREF) generator, for example a Zener diode 308 with a positive terminal coupled to an inverting input of the op-amp 304 and a negative terminal coupled to a ground voltage, VSS (e.g., about 0 Volts). The inverting input of the op-amp 304 is also coupled to a first resistor 312, and the voltage at the inverting input of the op-amp 304 is the reference voltage, VREF. The resistor 312 is also coupled to an input voltage, VIN. A non-inverting input of the op-amp 304 is coupled to a node 316 coupled between a second resistor 320 and a controllable resistor network 324.

In the example illustrated, the controllable resistor network 324 includes three (3) resistors 325 coupled between the node 316 and VSS (e.g., 0 V). Each such resistor 325 is coupled in parallel with a digitally controllable switch 326. The state of the switches is controllable with a set of digital controls. In other examples, there are more or less resistors and controllable switches 326 included. Closing of a controllable switch 326 shorts the corresponding resistor 325. Thus, the resistance between the node 316 and VSS varies based on how many (if any) of the controllable switches 326 are closed.

The second resistor 320 and the controllable resistor network 324 are arranged as a voltage divider. For convenience, it is presumed that the second resistor 320 has a resistance of R2 and the controllable resistor network has a resistance of R3. Moreover, the second resistor 320 is also coupled to a drain of a p-channel field effect transistor (PFET) 328. A source and body of the PFET 328 are coupled to the input voltage, VIN. Also, an output of the op-amp 304 is coupled to a gate of the PFET 328.

As is illustrated, the LDO voltage regulator 300 includes DFT elements that are controllable with an analog test bus (ATB). More specifically, the analog test bus enables controllability and visibility to internal circuit nodes and branches using analog multiplexers or switches to apply and/or measure node voltages, namely an ATB_V 336 and measure a node current, with ATB_I 332. Also, controllability options apply a known potential to a chosen circuit node, which is highlighted as ADFT 340. Setting values in the analog test bus, involving setting a specific state of control signals for analog multiplexers or switches and specific external stimulus in the form of voltage or current source or an external circuit, allows a state of the DFT elements to be set through opened or closed analog switches or selection of analog multiplexer inputs to appear at its output, which directly impacts the functionality and performance of the LDO voltage regulator 300 in the given example. For instance, setting values on the ATB_I 332 and/or the ATB_V 336 controls a voltage at the inverting input of the op-amp 304 and/or a voltage at the output of the op-amp 304.

Further, as noted, the resistance across the controllable resistive network 324, R3 is adjustable by changing a state of the corresponding switches 326. Thus, in the example illustrated, an analog parameter, namely an output voltage, VOUT is adjustable (e.g., trimmable) by digitally controlling the state of the switches 326. More specifically, Equation 1 defines a relationship between the reference voltage, VREF (a voltage applied at the inverting input of the op-amp 304), and the output voltage, VOUT (the voltage at the drain of the PFET 328). In Equation 1, it is presumed that the op-amp 304 is an ideal op-amp with no offset voltage error between the inverting and non-inverting inputs of the op-amp 304.

$$VREF = VOUT\left(\frac{R3}{R3+R2}\right)$$ Equation 1:

Wherein:
R3 is the controllable resistance of the controllable resistor network 324;
R2 is the resistance of the second resistor 320; and
VOUT<VIN.

Additionally, although these DFT elements are designed-in primarily for the purpose of test access, they can also be utilized to induce faulty circuit behavior. Accordingly, a DFT extractor (e.g., the DFT extractor 166 of FIG. 1) selects these DFT elements for the LDO voltage regulator 300 of FIG. 3.

Referring back to FIG. 1, the DFT extractor 166 determines DFT elements for the K number of analog circuit components 134 in a manner similar to the procedure explained with respect to FIG. 3. These DFT elements are employable as controllable elements to mimic faults and/or marginalities of the fabricated IC chip 104.

Responsive to determining the extra parameter controls and the DFT elements for the K number of analog circuit components 134, the IC fault engine 150 employs an analog fault simulator (AFS) 170 stored in the memory 116 to simulate a set (may be formed as an array) of faults in IC chips corresponding to the IC design 108, as well as a fault free reference version of an IC chip corresponding to the IC design 108. The faults in the set (may be formed as an array) of faults include, but are not limited to open faults, short circuits, mutual inductance, etc. There are G number of faults in the set (may be formed as an array) of faults, where G is an integer greater than or equal to one. In various examples, there are hundreds or thousands of faults in the set of faults. The AFS 170 records a particular fault and a signature of the fault. In some examples, different faults have the same signature. Thus, there are R number of signatures for G number of faults, where R is less than or equal to G. In some examples, the signature of a fault represents recordings of voltages at the ports of the IC chip during instantiation of a corresponding fault under a given excitation condition. The AFS 170 returns the set (may be formed as an array) of faults, $F_0 \ldots F_G$ and $F_{ref}$ (wherein $F_{ref}$ corresponds to the fault free reference version of the IC chip) along with the corresponding signatures, $S_0 \ldots S_R$, as well as $S_{ref}$ corresponding to $F_{ref}$ to the IC fault engine 150.

The IC fault engine 150 stores the set (may be formed as an array) of faults, $F_0 \ldots F_G$ and the corresponding signatures, $S_0 \ldots S_R$ as a fault universe 174. Table 1 illustrates one example of a simplified version of the fault universe 174. As illustrated in Table 1, some faults, such as faults $F_0$ and $F_2$ have the same signature, namely signature, $S_0$. For brevity and simplicity of illustration, one signature per fault is indicated in this illustration. However, the fault and corresponding signature is determined and recorded for each test program in the identified test suite. Without loss of generality, it can be extended that each signature in Table 1 can be a collection of multiple sub-signatures each corresponding to a test program in the identified test suite.

TABLE 1

| FAULT | SIGNATURE |
|---|---|
| $F_{ref}$ | $S_{ref}$ |
| $F_0$ | $S_0$ |
| $F_1$ | $S_1$ |
| $F_2$ | $S_0$ |
| $F_3$ | $S_2$ |
| $F_4$ | $S_3$ |
| $F_5$ | $S_2$ |
| ... | ... |
| $F_G$ | $S_R$ |

The IC fault engine 150 collates the extra parameter controls and the DFT elements for the K number of analog circuit components 134 to form a set (may be formed as an array) of design for fault injection (DfFI) instances for the IC design 108. The DfFI instances define a specific state of controllable elements for the K number of analog circuit components 134 in the IC design 108 to mimic faults. For example, a DfFI instance can represent an instance of the IC design 108 wherein a unique combination of trim codes for operating parameters and closed switches of DFT elements for a particular analog circuit component 134 is activated. There are Q number of DfFI instances in the set (may be formed as an array) of DfFI instances, where Q is an integer greater than or equal to one. More particularly, there are $DfFI_0 \ldots DfFI_Q$ instances. In various examples, there are hundreds, thousands or millions of DfFI instances. The IC fault engine 150 provides the set (may be formed as an array) of DfFI instances to a circuit simulator 176.

In response to receipt of the DfFI instances, the circuit simulator 176 simulates the IC design 108 with each DfFI instance activated and records a signature for the DfFI instances. In some examples, each signature of a DfFI instance represent voltages on ports of the IC chip with a corresponding DfFI instance activated. Similar to the faults simulated by the AFS 170, some of the DfFI instances have the same signatures. For the Q number of DfFI instances, there are D number of signatures where D is an integer greater than or equal to two, and D is less than or equal to Q. The DfFI instances and the corresponding signatures are returned to the IC fault engine 150. The IC fault engine 150 stores the Q number of DfFI instances ($DfFI_0 \ldots DfFI_Q$) along with the corresponding signature in a DfFI universe 178.

Table 2 illustrates one example of a simplified version of the DfFI universe 178. As illustrated in Table 2, some faults, such as DfFI instances $DfFI_0$ and $DfFI_1$ have the same signature, namely signature, $S_0$. As illustrated, some DfFI instances have the same signature as the faults, $F_0 \ldots F_G$. For simplicity, it is presumed that the last DfFI, $DfFI_Q$ instance has the same signature, $S_R$ as the fault $F_G$, but in other examples, the $DfFI_Q$ has a different signature than the fault $F_G$. Also, in various examples, some DfFI instances, such as DfFI$_3$ have the same signature as $F_{ref}$, indicating that the particular DfFI instance does not mimic a fault. Though Table 2 illustrates one example where one DfFI element activation is indicated, in other variant approaches, it is possible to activate more than one DfFI element contemporaneously or in a specific sequence. For brevity and simplicity of illustration, though one signature per DfFI is indicated in this illustration, the DfFI to signature equivalence is determined and recorded for each test program in the identified test suite. Without loss of generality, it can be extended that each signature in Table 2 can be a collection of multiple sub-signatures each corresponding to a test program in the identified test suite.

TABLE 2

| DfFI | SIGNATURE |
|---|---|
| DfFI$_0$ | S$_0$ |
| DfFI$_1$ | S$_0$ |
| DfFI$_2$ | S$_1$ |
| DfFI$_3$ | S$_{ref}$ |
| DfFI$_4$ | S$_3$ |
| DfFI$_5$ | S$_2$ |
| ... | ... |
| DfFI$_Q$ | S$_R$ |

The IC fault engine 150 parses the fault universe 174 and the DfFI universe 178 to match signatures of particular DfFI instances with particular faults. More particularly, as noted, some of the DfFI instances have the same signature as one or more faults. For instance, DfFI$_0$ and DfFI$_1$ have the same signatures, S$_0$ as faults F$_0$ and F$_2$. This indicates that DfFI$_0$ and DfFI$_1$ both mimic the behavior of faults F$_0$ and F$_2$. Accordingly, the IC fault engine 150 generates or updates the DfFI-fault equivalence dictionary 154 that characterizes the correspondence of DfFI instances to faults and the corresponding signatures. Table 3 illustrates one example of a simplified version of the DfFI-fault equivalence dictionary 154.

TABLE 3

| DfFI | SIGNATURE | FAULT |
|---|---|---|
| DfFI$_0$ | S$_0$ | F$_0$, F$_2$ |
| DfFI$_1$ | S$_0$ | F$_0$, F$_2$ |
| DfFI$_2$ | S$_1$ | F$_1$ |
| DfFI$_3$ | S$_{ref}$ | N/A |
| DfFI$_4$ | S$_3$ | F$_4$ |
| DfFI$_5$ | S$_2$ | F$_3$, F$_5$ |
| ... | ... | ... |
| DfFI$_Q$ | S$_R$ | F$_G$ |

As demonstrated in Table 3, the DfFI instance DfFI$_3$ is marked as N/A indicating that the DfFI$_3$ does not mimic a fault. Also, as illustrated, DfFI instances, DfFI$_0$ and DfFI$_1$ have the same signatures (S$_0$) and are therefore both employable to mimic the same faults, namely, F$_0$ and F$_2$. Thus, in some examples, the IC fault engine 150 is configured to prune (e.g., tune) the DfFI-fault equivalence dictionary 154 to remove redundant DfFI instances. Further, in some examples, not all of the faults simulated by the AFS 170 have a signature that matches a DfFI instance.

Responsive to generating the DfFI-fault equivalence dictionary 154, the IC fault engine 150 provides the DfFI-fault equivalence dictionary 154 to an IC test engine 182. The IC test engine 182 analyzes the DfFI-fault equivalence dictionary 154 and determines if fault coverage meets a fault coverage threshold (e.g., 70%-90%), which threshold varies based on the environment in which the fabricated IC chip 104 is to be employed. The fault coverage is based on a determination of the number of faults that can be mimicked by DiFI instances. In some examples, if the fault coverage does not meet the fault coverage threshold (indicating that the fault coverage provided by the DfFI-fault equivalence dictionary 154 is insufficient), the test suite is modified such that a different tests (e.g., test programs) are employed to replace tests in the test suite and/or the test suite is augmented with additional tests. Additionally or alternatively, if the fault coverage does not meet the fault threshold, the IC design 108 is modified to add additional controllable elements, such as additional DFT elements and/or additional tuning parameters that result in additional DfFI instances, and the procedure for generating the DfFI-fault equivalence dictionary 154 is repeated. In some examples, the IC design 108 is modified with an EDA application on the remote system 128. In other examples, the IC design 108 is modified automatically (e.g., by the IC fault engine 150).

In response to the fault coverage meeting the required, acceptable fault coverage threshold, the IC test engine 182 (or other entity) releases the IC design 108 for fabrication of a limited number (e.g., 1000 or less) of IC chips corresponding to the IC design 108. Stated differently, a limited number of fabricated IC chips 104 are provided in response to determining that the fault coverage of the DfFI-fault equivalence dictionary 154 is sufficient (e.g., meets the fault coverage threshold). For the examples provided, it is ensured, both through careful fabrication process control and by extensive testing, that a selected fabricated IC chip 104 is fault free at this stage involving limited samples, which is alternatively referred to as a reference fabricated IC chip 104.

The IC test engine 182 generates M number of tests 186 (e.g., test patterns), where M is an integer greater than or equal to one. More particularly, the IC test engine 182 generates tests 186 and/or manages identified tests T$_0$ ... T$_M$. The M number of tests 186 are provided to automatic test equipment (ATE) 190. The ATE 190 is coupled to the interface 140, enabling the ATE 190 to inject the M number of tests 186 (or some subset thereof) on the fabricated IC chip 104 and receive results of execution of the tests 186, which are recorded as test result data. The ATE 190 is configured to apply each of the M number of tests 186 to the fabricated IC chip 104. As noted, the fabricated IC chip 104 is presumed and ensured to be a fault free IC chip. Thus, the test result data for application of each of the M number of tests 186 is also presumed to indicate a pass for each of the M number of tests 186. Stated differently, because the fabricated IC chip 104 is presumed and ensured to be fault free, a pass is recorded in the test result data for each of the M number of tests 186.

Also, the ATE 190 is employable to activate the Q number of DfFI instances of the DfFI-fault equivalence dictionary 154 on the fabricated IC chip 104. More specifically, the ATE 190 is configured to activate parameter controls and/or DFT elements for a particular DfFI instance (of the Q number of DfFI instances) on the fabricated IC chip 104, enabling the fabricated IC chip to mimic equivalent faults. The ATE 190 is also configured to apply each of the M number of tests 186 to each of the Q number of DfFI instances (or some subset thereof) and to record results. As noted, the fabricated IC chip 104 is presumed and ensured to be a fault free IC chip. As an example, test, To is applied against DfFI$_0$-DfFI$_Q$, and T$_1$ is also applied against DfF$_0$-DfFI$_Q$. The results for each such test are recorded in the test result data. The test result data is returned to the IC test engine 182, where the test result data is analyzed. In particular, for each failed test, the corresponding DfFI is recorded. Additionally, as noted, certain DfFI instances are employable to mimic particular faults, as indicated by the DfFI-fault equivalence dictionary 154. Table 4 illustrates an example of a correspondence between failed tests, DfFI instances and corresponding faults.

TABLE 4

| TEST | DfFI | FAULT |
| --- | --- | --- |
| $T_0$ | $DfFI_2$ | $F_1$ |
| $T_1$ | $DfFI_0$ | $F_0, F_2$ |
| $T_1$ | $DfFI_Q$ | $F_G$ |
| $T_2$ | $DfFI_4$ | $F_4$ |
| $T_3$ | $DfFI_4$ | $F_4$ |
| $T_4$ | $DfFI_5$ | $F_3, F_G$ |
| ... | ... | ... |
| $T_M$ | $DfFI_Q$ | $F_G$ |

Table 4 indicates that a failure of test pattern $T_0$ is recorded when the $DfFI_2$ instance is activated. As indicated in the DfFI-fault equivalence dictionary 154, and in Table 3, $DfFI_2$ mimics fault $F_1$. Accordingly, Table 4 demonstrates that test $T_0$ is employable to detect fault $F_1$. Similarly, a failure of test $T_1$ is recorded when either $DfFI_0$ or $DfFI_Q$ is activated. As indicated in the DfFI-fault equivalence dictionary 154, and in Table 3, $DfFI_0$ mimics faults $F_0$ and $F_2$, and $DfFI_Q$ mimics fault $F_G$. Thus, test $T_1$ is employable to detect faults $F_0$, $F_2$ and $F_G$. Still further, failures of test $T_2$ and test $T_3$ are recorded when $DfFI_4$ is activated. As indicated in the DfFI-fault equivalence dictionary 154, and in Table 3, $DfFI_4$ mimics fault $F_4$. Thus, both tests $T_2$ and $T_3$ are employable to detect fault $F_4$.

The IC test engine 182 analyzes the test result data to adjust the tests 186. In particular, the IC test engine 182 tunes the M number of tests 186 based on the test result data. For example, in the example illustrated by Table 4, both test $T_2$ and $T_3$ are employable to detect the same fault, namely, fault $F_4$. Therefore, in some examples, the IC test engine 182 removes test $T_2$ or $T_3$ from the tests 186 to reduce redundancy, as long as no other dependencies are violated. Similarly, analysis of Table 4 reveals that both tests $T_1$ and $T_M$ are employable to test for fault $F_G$. Accordingly, test pattern $T_M$ is also removed in some examples for being redundant. Such tuning of the tests 186 reduces the total number of tests needed to sufficiently test fabricated IC chips 104.

Further, in some examples, the analysis of the test result data by the IC test engine 182 reveals that a failure of some of the tests never occurs. In such an example, the IC test engine 182 removes these tests from tests 186 because these tests are not employable to detect a fault. Further still, in some examples, the analysis of the test result data executed by the IC test engine 182 reveals that the tests 186 do not meet the fault coverage threshold because some of the faults $F_0 \ldots F_G$ are not detectable by any of the tests $T_0 \ldots T_M$. Stated differently, in some examples, after execution of the tests $T_0 \ldots T_M$ for the DfFI instances, $DfFI_0 \ldots DfFI_Q$, one or more of the faults $F_0 \ldots F_G$ is still not detectable, such that the total number of faults detectable by the tests $T_0 \ldots T_M$ is below the fault coverage threshold. In these examples, the IC test engine 182 adds additional tests to the tests 186, and these tests are applied to the fabricated IC chip 104 and analyzed in a similar manner. Additionally or alternatively, in examples where the fault coverage of tests $T_0 \ldots T_M$ is below the fault coverage threshold, additional controllable elements (e.g., extra parameter controls and/or DFTs) are added to the IC design 108 to increase the number of DfFIs in the DfFI universe 178, which DfFI universe 178 is re-evaluated to expand testability of the faults $F_0 \ldots F_G$, and the process of evaluating the tests $T_0 \ldots T_M$ is repeated.

In response to determining a set of tests 186 that are sufficient to meet the fault coverage threshold, a large volume of IC chips based on the IC design 108 are released for fabrication by the IC test engine 182 (or other entity). This large volume of fabricated IC chips 104 are testable with the set of tests 186 that meet the fault coverage threshold. By employing the system 100, an accurate set of tests 186 for testing the fabricated IC chips 104 is generated prior to fabrication of a large volume of fabricated IC chips 104. More particularly, as explained, each of the tests 186 is fault graded and thoroughly validated to be employable to test for a particular fault (or a particular set of faults) before the volume of IC chips is released for fabrication by the IC test engine 182. In this manner, the possibility of faulty fabricated IC chips 104 (e.g., fabricated IC chips 104 that contain a detectable fault) that are distributed to third parties (e.g., customers) is eliminated or probability of its occurrence made negligible and/or a possibility of test cost escalation due to redundant or ineffective tests avoided. In particular, the set of tests 186 has already been verified to meet the fault coverage threshold. Accordingly, after fabrication, the volume of IC chips is tested with the set of tests 186, and IC chips that have detectable faults are discarded prior to distribution to the third parties. Conversely, in conventional testing schemes, tests sufficient to meet the fault coverage threshold are created and may be fault graded before volume fabrication, but are evaluated after volume fabrication of IC chips involving significant test cost, IC chip samples and a finite possibility of test escape in the event of use of ineffective test suite to start with, and may involve test modification including creation, augmentation and/or replacement after sufficient volume testing based on the evaluation outcome.

By employment of the system 100, DfFI instances and the corresponding DfFI-fault equivalence dictionary 154 are employable together as an efficient diagnostic toolset to localize a possible root-cause for a failure, in case of an unexpected failure during a manufacturing test or a failure in an application field (commonly referred to as customer return). More specifically, the DfFI instances are used during a life-time of the fabricated IC chip 104 to evaluate the effect of injected faults on silicon performance in the presence of aging and operating stress conditions, and system application and environment conditions. For example, DfFI instances are employable to perturb modelled or manufactured circuits to create functional fault models, whereby the original function maps to a faulty function in ways which cannot be realized using single stuck-open or stuck-short faults. Stated differently, DfFI instances are employable to dynamically create perturbations in the manufactured circuit (e.g., instances of the fabricated IC chip 104) to enhance analysis of behaviors which are complicated and/or computationally expensive to model in simulation. Critical behaviors can thereby be analyzed and action taken for fault detection using programmable monitors during application operation. In this manner, the DfFI instances are employed to emulate in design and evaluate in silicon the effects of injected faults in the presence of other parametric variations due to test conditions, system application and environment conditions, aging and operating stress conditions, thereby helping to trigger latent behaviors which cannot be excited without the DfFI instances.

Figure 4:
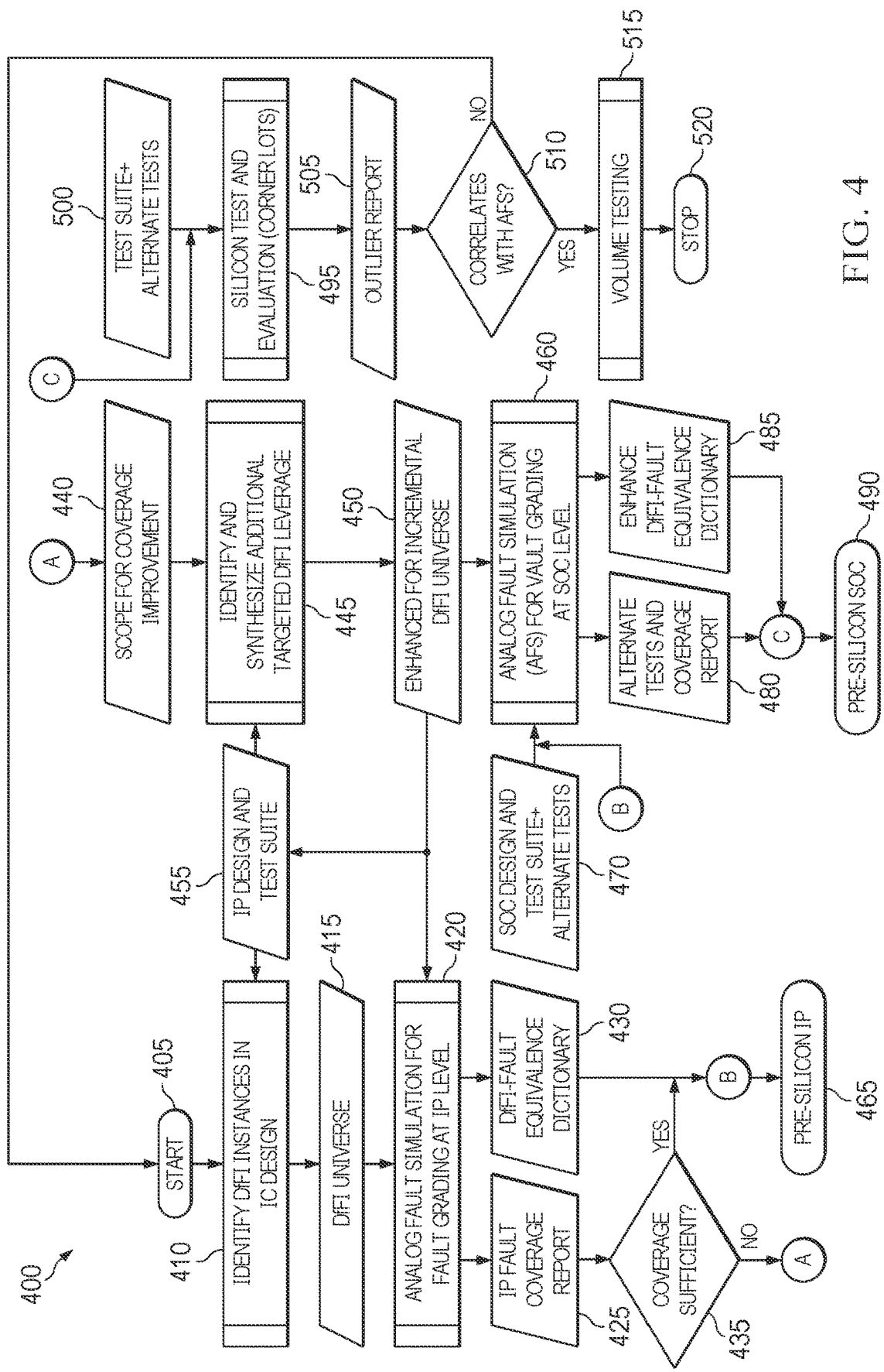
FIG. 4 illustrates a flowchart of an example method for analyzing a design of IC chips, and for fabricating and testing the IC chips.

FIG. 4 illustrates a flowchart of an example method 400 for analyzing the design, fabricating, and testing of IC chips. In some examples, the method 400 is implemented with an IC chip fabrication facility that includes the system 100 of FIG. 1. The method 400 starts at 405 and proceeds to 410. At 410, an IP design and a test suite for the IP design (as managed/generated by an IC test engine, such as the IC test engine 182 in FIG. 1) from 455 (e.g., the IP blocks 132 in IC design 108 of FIG. 1) is analyzed by an IC fault engine (e.g., the IC fault engine 150 of FIG. 1) to identify DfFI instances from controllable elements, such as overdesign elements and DFT elements that are present in an IC design, as noted with respect to FIG. 1. At 415, a DfFI universe (e.g., the DfFI universe 178 of FIG. 1) is generated. To generate the DfFI universe, a circuit simulator (e.g., the circuit simulator 176 of FIG. 1) simulates operation of the IP design with the DfFI elements activated to determine a signature for the DfFI elements, as illustrated in Table 2.

At 420, an AFS (e.g., the AFS 170 of FIG. 1), performs fault simulation of an IC design (e.g., the IP level) with a given set of tests of the test suite of the IP design, and records a signature for each of the faults. The faults and corresponding signatures are recorded by the IC fault engine as a fault universe (e.g., the fault universe 174 of FIG. 1), as illustrated in Table 1. The method 400 proceeds in parallel to 425 and 430.

At 425, a fault coverage report characterizing the fault coverage of the fault universe, and the method proceeds to 435. At 430, the IC fault engine 150 generates a DfFI-fault equivalency (e.g., the DfFI-fault equivalence dictionary 154 of FIG. 1) based on a comparison of signatures in the fault universe and the DfFI universe, and the method 400 proceeds to node B. At 435, the fault coverage report is analyzed to determine if a fault coverage threshold is met (indicating sufficient fault coverage). If the determination at 435 is positive (e.g., YES), the method 400 proceeds to node B. If the determination at 435 is negative (e.g., NO), the method 400 proceeds to node A.

Node A proceeds to 440, where the IC fault engine 150 determines what fault coverage improvement is needed to meet the fault coverage threshold. At 445, additional controllable elements, such as additional tuning parameters and/or DFT elements are added to the IC design to provide additional DfFI instances. At 450, the circuit simulator evaluates the added DfFI instances to provide an enhanced or additional DfFI universe, and in parallel the method 400 proceeds to 460 and returns to 420. At 455, the IC design (e.g., the IP design) and a test suite are updated, and the method 400 returns in parallel to 410, 445 and 420.

Node B proceeds to 460 and 465 in parallel. At 465 the IC design (pre-silicon IP) is deemed to be completed. Additionally, in some examples, an alternative IC design for fabrication (system on chip (SOC) design that is built using the IP blocks ready from the previous stage at node B) and the associated test suite (as managed/generated by the IC test engine, such as the IT test engine 182 in FIG. 1) is provided at 470. At 460, (from node B), the AFS fault simulates the updated IC design for fabrication and the associated test suite provided at 470, and the method 400 proceeds to 480 and 485 in parallel.

At 480, the alterative tests are evaluated by an IC test engine (e.g., the IC test engine 182 of FIG. 1), and a coverage report is generated, and the method 400 proceeds to node C. At 485, DfFI-Fault equivalence dictionary is enhanced by the IC fault engine to reflect the changes to the DfFI instances, and the method 400 proceeds to node C.

Node C proceeds in parallel to nodes 490 and 495. At 490, a pre-silicon SOC is released for fabricating a limited number of IC chips, such as corner lots (e.g., process corners). At 500, the IC test engine generates tests or manages identified tests for the limited number of fabricated IC chips. Additionally, in some examples, at 500, alternative tests are provided. At 495, the tests (including the alternative tests) are tested against the DfFI instances in the DfFI universe. Moreover, at 505 results (recorded in test data) are analyzed by the IC test engine to provide an outlier report that provides fault coverage for the generated tests. At 510, a determination is made as to whether the outlier report correlates with the AFS for the IC design. If the determination at 510 is negative (e.g., NO), the method 400 returns to 405, if the determination at 510 is positive (e.g., YES), the method proceeds to 515. At 515, it is determined that the tests provide sufficient fault coverage for testing a volume of IC chips fabricated using the IC design. Thus, at 515, the IC design is released for volume fabrication and the tests generated are employed for volume testing of the volume of fabricated IC chips, and the method 400 ends at 520.

By implementing the method 400, the full set of tests with sufficient coverage that correlates with the AFS is generated and comprehensively validated prior to volume fabrication of IC chips. In this manner, the number of faulty IC chips distributed to third parties (e.g., customers) is eliminated or the probability of its occurrence made negligible. Additionally, the overall design cycle time before volume testing readiness is reduced by making the AFS analysis executed at 460 more efficient by avoiding use of raw fault injection for all the faults located inside the IPs, and using the DfFI elements ably supported by the DfFI-fault equivalence dictionary from the IP level analysis. The overall design cycle time before volume testing readiness is also reduced by enabling defect oriented testing with limited samples of known good dies at 495, and thus advancing the test suite evaluation and validation, including for any alternate tests under evaluation to the lab characterization phase using limited samples of known good dies. Further, the overall design cycle time before volume testing readiness is also reduced by avoiding the same at volume testing phase at 515 contrary to what is done otherwise in conventional methods, and thus saving significant cycle time, test time and test cost in addition to any remote possibility of faulty devices with hard to find faults escaping the volume test due to questionable test effectiveness at the early phases of volume testing due to the defect oriented test effectiveness analysis still being performed.

Figure 5A:
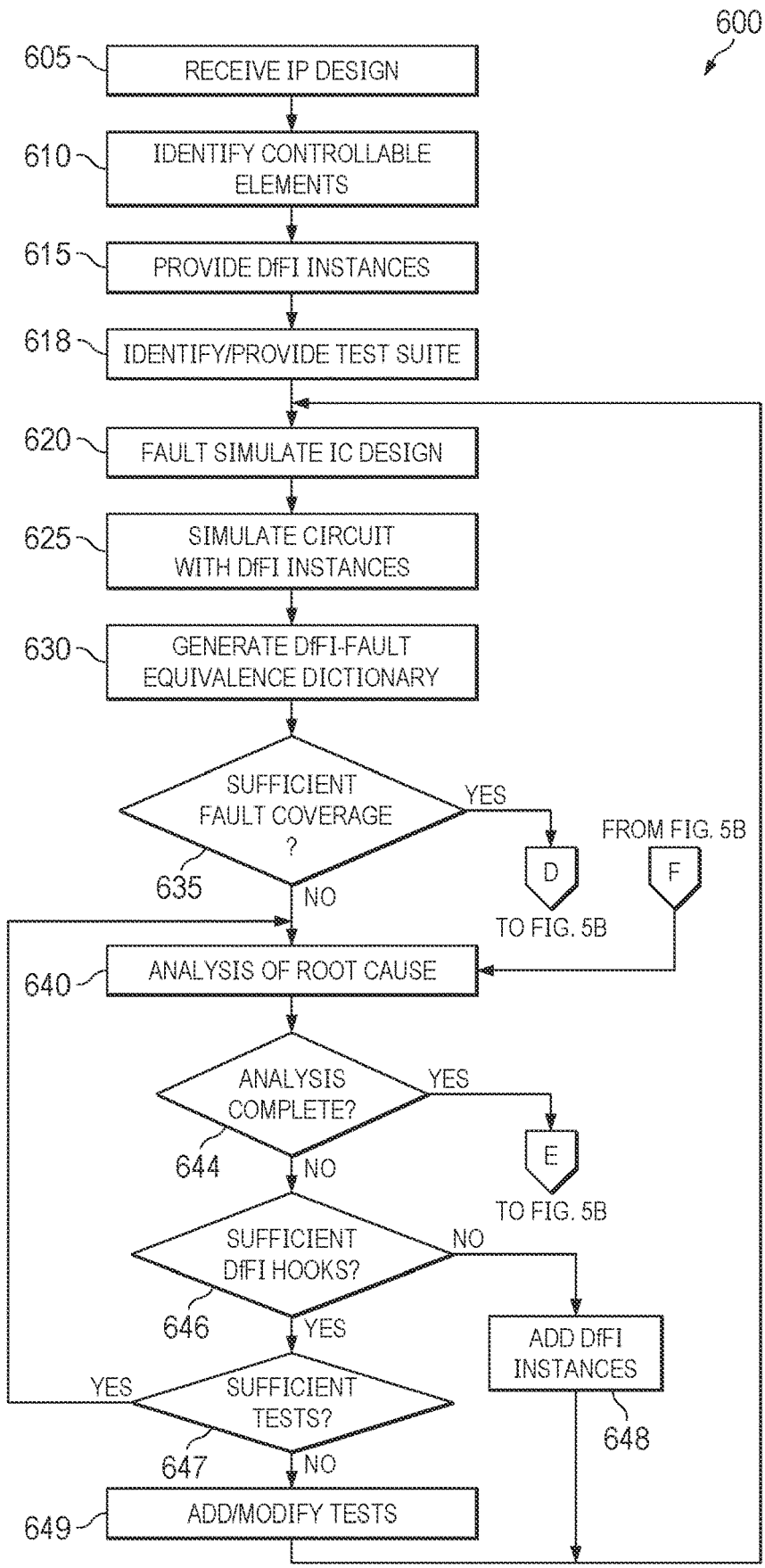
FIGS. 5A and 5B are a flowchart of an example method for generating and/or managing tests for IC chips.
Figure 5B:
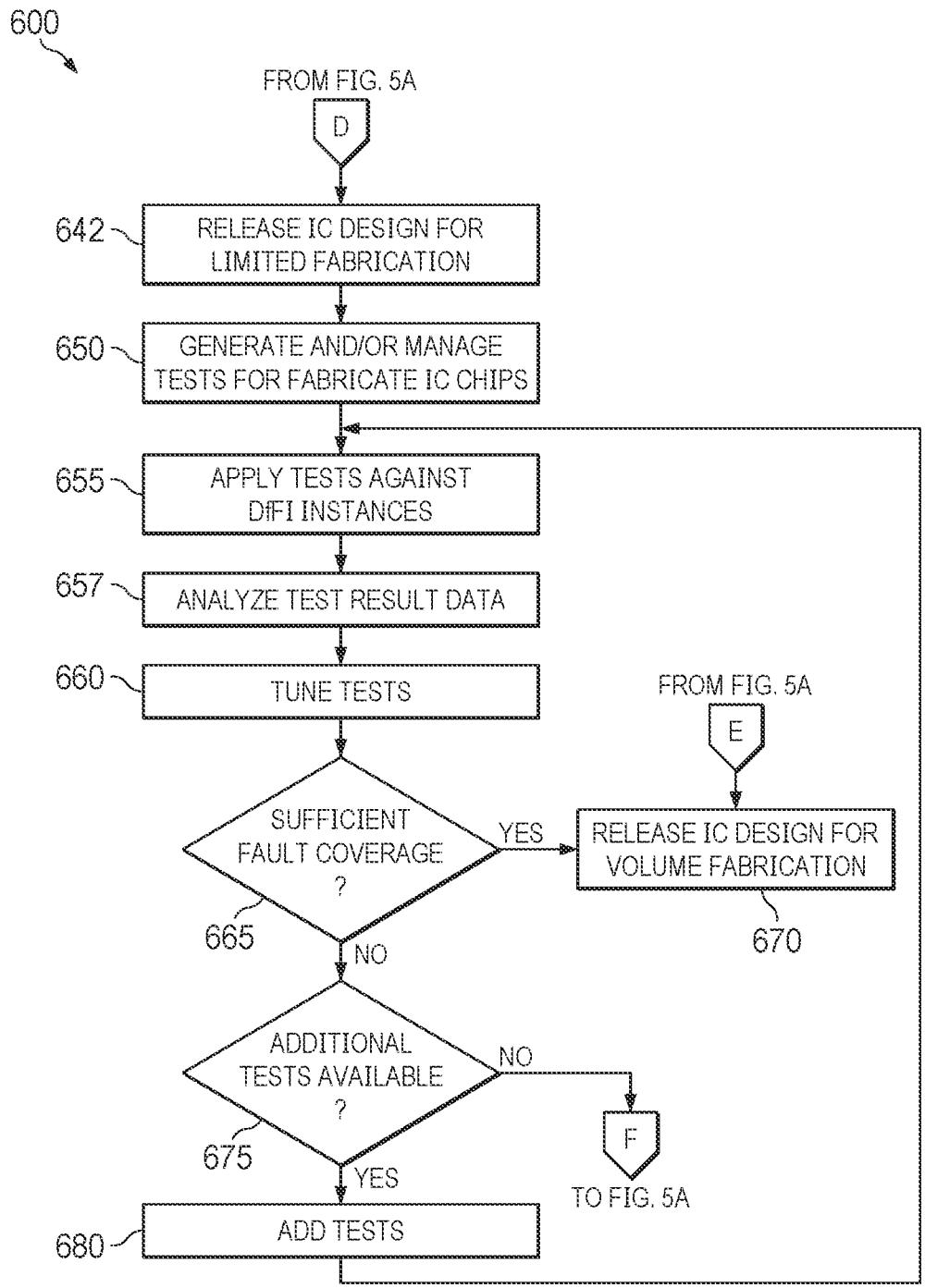

FIGS. 5A and 5B illustrate a method 600 for generating and verifying tests to test a volume of fabricated IC chips. In some examples, the method 600 is implemented with the system 100 of FIG. 1. At 605, a computing platform (e.g., the computing platform 112 of FIG. 1) receives an IC design for an IC chip. At 610, an IC fault engine (e.g., the IC fault engine 150 of FIG. 1) analyzes an IC specification for the IC design and/or the IC design itself to identify controllable elements that are employable for DfFI instances. The controllable elements include overdesign elements, such as extra parameter controls described with respect to FIG. 2. The controllable elements also include a selection of DFT elements, such as the DFT elements of the LDO voltage regulator 300 explained with respect to FIG. 3.

At 615, the IC fault engine provides DfFI instances that are employable from the controllable elements. Each DfFI instance represents a unique combination of digital controls of the controllable elements to set a state of the IC design. At 618, a test suite for the IP design (as managed/generated by an IC test engine, such as the IC test engine 182 in FIG. 1) is provided and/or identified. At 620, an AFS fault simulates the IC design with the corresponding test suite and in the presence of each fault from the fault universe, and determines a signature for each fault. The AFS returns the faults, along with signatures of the faults to the IC fault engine. In response, the IC faults and the corresponding signatures are recorded in a fault universe (e.g., the fault universe 174 of FIG. 1).

At 625, a circuit simulator (e.g., the circuit simulator 176 of FIG. 1) simulates the IC design with each of the DfFI instances activated (or some subset thereof), and determines a signature for each of the DfFI instances. The circuit simulator returns the DfFI instances with the corresponding signatures to the IC fault engine. In response, the IC fault engine stores the DfFI instances with the corresponding signatures in a DfFI universe (e.g., the DfFI universe 178 of FIG. 1).

At 630, the IC fault engine analyzes the fault universe and the DfFI universe to determine a DfFI-fault equivalence dictionary (e.g., the DfFI-fault equivalence dictionary 154 of FIG. 1). In particular, DfFI instances that have the same signatures as faults are employable to mimic the faults. At 635, the IC test engine determines if the DfFI-fault equivalence dictionary provides sufficient fault coverage. More specifically, the DfFI-fault equivalence provides sufficient fault coverage if the percentage of faults that are mimicked by a DfFI instances meets a fault coverage threshold. If the determination at 635 is negative (e.g., NO), the method 600 proceeds to 640. If the determination at 635 is positive (e.g., YES), the method 600 proceeds to 642.

At 640, the IC test engine analyzes the faults to determine a possible root-cause for a failure of an IC design, and the method 600 proceeds to 644. At 644, the IC engine makes a determination as to whether the analysis of the root cause has been completed. If the determination at 644 is positive (e.g., YES), the method 600 proceeds to Node A (to 670). If the determination at 644 is negative (e.g., NO), the method 600 proceeds to 646. At 646, the IC test engine makes a determination as to whether sufficient DfFI hooks (e.g., DFT elements and parameter controls extracted from DfFI instances) are present in the IC design. If the determination at 646 is positive (e.g., YES), the method 600 proceeds to 647. If the determination at 646 is negative (e.g., NO), the method 600 proceeds to 648.

At 647, the IC test engine makes a determination as to whether sufficient tests are available for the IC design. If the determination at 647 is positive (e.g., YES), the IC test engine determines that further fault coverage and/or improvements are not available, and the method 600 returns to 640. If the determination at 647 is negative (e.g., NO), the method 600 proceeds to 649.

At 648 (from 646), the IC design is modified in a manner to add additional DfFI instances. In particular, in some examples, additional DFT elements and/or additional tuning parameters are added to the IC design to increase the number of DfFI instances, and the method returns to 620. At 649 (from 647), the IC test engine adds and/or modifies the tests, and the method 600 returns to 620. For instance, in some examples, the test suite is modified to replace tests with different tests (e.g., test programs) or augmented with additional tests.

At 642 (from 635), the IC design (e.g., pre-silicon IP) is released by the IC test engine (or other entity) for fabrication of a limited number of IC chips (e.g., the fabricated IC chip 104), and the method 600 proceeds to 650. The fabricated IC chips in the limited production are presumed and ensured by careful control of fabrication process and sufficient testing to be fault free IC chips. At 650, an IC test engine (e.g., the IC test engine 182 of FIG. 1) generates tests and/or manages identified tests (e.g., test patterns) for the fabricated IC chip. In some examples, also at 650, an ATE applies the test to the fabricated IC chip and returns test result data to the IC test engine. In such examples, the IC test engine analyzes the test result data to ensure that the fabricated IC chip passed the tests, thereby indicating that the fabricated IC chip is fault free.

At 655, the ATE (e.g., the ATE 190 of FIG. 1) applies the tests on the fabricated IC chip against the DfFI instances in the DfFI universe. More particularly, the ATE is configured to activate each DfFI instance in the DfFI-fault equivalence dictionary, and run each of the tests against the activated DfFI instance and to record the results of the test. The test result data is returned to the IC test engine. In response, at 657, the IC test engine analyzes the test result data to determine which of the tests are employable to test for which particular faults, such as illustrated in Table 4. That is, analysis of the test result data reveals the ability of the tests to test for faults. At 660, the IC test engine tunes the tests to remove redundant and/or unnecessary tests. At 665, the IC test engine analyzes the tests to determine if the tests provide sufficient fault coverage. More particularly, at 665, the IC test engine determines if the fault coverage provided by the tests meets the fault coverage threshold. If the determination at 665 is positive (e.g., YES), the method 600 proceeds to 670. If the determination at 665 is negative (e.g., NO), the method 600 proceeds to 675. Node A (from 644) also flows to 670. At 670, the IC test engine (or other entity) releases the IC design for volume fabrication because the tests generated and/or identified have been validated to provide sufficient fault coverage.

At 675, a determination is made by the IC test engine as to whether additional tests are available for the IC design. If the determination at 675 is negative (e.g., NO), the method 600 returns to 640. If the determination at 675 is positive (e.g., YES), the method 600 proceeds to 680. At 680, the additional tests are added to the tests, and the method 600 returns to 655.

Modifications are possible in the described examples, and other examples are possible, within the scope of the claims.

What is claimed is:

1. A method for evaluating tests for fabricated integrated circuit (IC) chips comprising:
    providing, by an IC fault engine operating on a computing platform, design for fault injection (DfFI) instances of an IC design that characterize activatable states of controllable elements in an IC chip based on the IC design;
    fault simulating, by an analog fault simulator (AFS) operating on the computing platform, the IC design and a corresponding identified test suite to determine a signature for faults;
    simulating, by a circuit simulator operating on the computing platform, the IC design with the DfFI instances activated to determine a signature for the DfFI instances;
    generating, by the IC fault engine, a DfFI-fault equivalence dictionary based on a comparison of the signature of the faults and the signatures of the DfFI instances;
    generating and/or managing, by an IC test engine operating on the computing platform, tests for a fabricated IC chip that is based on the IC design;

receiving, by the IC test engine, test result data that characterizes the tests being applied against the fabricated IC chip based on the IC design with the DfFI instances activated; and analyzing, by the IC test engine, the test result data to determine an ability of the tests to detect the faults.

2. The method of claim 1, further comprising identifying, by the IC test engine operating on the computing platform, extra parameter controls that control parameters of an analog component of the IC design that are employable as a subset of the controllable elements for the DfFI instances.

3. The method of claim 2, wherein tuning parameters of the controllable elements are digitally controlled.

4. The method of claim 3, wherein the analog component comprises a low dropout (LDO) voltage regulator, and parameters controlled by the extra parameter controls at least one of a output voltage, reference voltage, bias current, gain and a bandwidth of an error amplifier of the LDO voltage regulator.

5. The method of claim 3, further comprising selecting design for testability (DFT) elements in the IC design that are controllable to test the analog component of the IC chip, wherein the DFT elements are employable as a subset of the controllable elements for the DfFI instances.

6. The method of claim 5, wherein the DFT elements are controllable by an analog test bus.

7. The method of claim 6, wherein the analog component includes a voltage regulator, and the DFT elements comprise switches for measuring voltage and current on nodes and branches respectively of the voltage regulator.

8. The method of claim 1, wherein the fabricated IC chip is a fault free fabricated IC chip.

9. The method of claim 1, further comprising:
analyzing, by the IC test engine, the DfFI-fault equivalence dictionary to determine a fault coverage of the DfFI-fault equivalence dictionary; and
modifying the IC design to add additional controllable elements to the IC design to increase a number of DfFI instances in response to determining that the fault coverage of the DfFI-fault equivalence is below a fault coverage threshold.

10. The method of claim 1, further comprising tuning the tests to remove redundant and/or unnecessary tests for the IC chip.

11. The method of claim 1, further comprising analyzing the tests to determine a fault coverage of the tests.

12. The method of claim 11, further comprising at least one of adding additional tests and modifying the IC design to increase the DfFI instances in response to determining that the fault coverage is below a fault coverage threshold.

13. The method of claim 11, further comprising, releasing the IC design for volume fabrication of IC chips based on a determination that the fault coverage of the tests meets a fault coverage threshold.

14. A system for evaluating tests for integrated circuit (IC) chips, the system comprising:

a non-transitory memory for storing machine readable instructions; and
a processing unit for accessing the non-transitory memory and executing the machine readable instructions, the machine readable instructions comprising:
an IC fault engine configured to:
provide design for fault injection (DfFI) instances of an IC design that characterize activatable states of controllable elements in an IC chip based on the IC design;
generate a fault universe based on data from an analog fault simulator (AFS) characterizing faults, tests and signatures of the faults;
generate a DfFI universe based on data from a circuit simulator characterizing signatures of the DfFI instances; and
generate a DfFI-fault equivalence dictionary based on a comparison of the signature of the faults and the signatures of the DfFI instances; and
an IC test engine configured to:
generate and/or manage tests for a fabricated IC chip that is based on the IC design;
receive test result data that characterizes the tests being applied against the fabricated IC chip based on the IC design with the DfFI instances activated; and
analyze the test result data to determine an ability of the tests to detect the faults.

15. The system of claim 14, further comprising automatic test equipment (ATE) coupled to the fabricated IC chip, wherein the ATE applies the tests to the fabricated IC chip with the DfFI instances activated and provides the test result data to the IC test engine.

16. The system of claim 14, wherein the IC test engine is further configured to:
identify tuning parameters that are digitally controlled to control parameters of an analog component of the IC design that are employable as a first subset of the controllable elements for the DfFI instances; and
select design for testability (DFT) elements in the IC design that are controllable through an analog test bus to test the analog component of the IC chip that are employable as a second subset of the controllable elements for the DfFI instances.

17. The system of claim 14, wherein the fabricated IC chip is a fault free fabricated IC chip.

18. The system of claim 14, wherein the IC test engine is further configured to analyze the DfFI-fault equivalence dictionary to determine a fault coverage of the DfFI-fault equivalence dictionary.

19. The system of claim 14, wherein the IC test engine analyzes the tests to determine a fault coverage of the tests.

20. The system of claim 19, wherein the IC design is released by the IC test engine for volume fabrication of IC chips in response to determining the fault coverage meets a fault coverage threshold.

* * * * *